US010431450B2

(12) United States Patent
Ouchi

(10) Patent No.: US 10,431,450 B2
(45) Date of Patent: Oct. 1, 2019

(54) FILM FORMING METHOD

(71) Applicant: TOKYO ELECTRON LIMITED, Tokyo (JP)

(72) Inventor: Kenji Ouchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/915,853

(22) Filed: Mar. 8, 2018

(65) Prior Publication Data
US 2018/0261452 A1 Sep. 13, 2018

(30) Foreign Application Priority Data
Mar. 10, 2017 (JP) ................... 2017-046471

(51) Int. Cl.
*H01L 21/02* (2006.01)
*H01J 37/32* (2006.01)
*C23C 16/04* (2006.01)
*C23C 16/30* (2006.01)
*C23C 16/455* (2006.01)
(Continued)

(52) U.S. Cl.
CPC ........ *H01L 21/02131* (2013.01); *C23C 16/04* (2013.01); *C23C 16/30* (2013.01); *C23C 16/45523* (2013.01); *C23C 16/509* (2013.01); *C23C 16/515* (2013.01); *H01J 37/3211* (2013.01); *H01J 37/32449* (2013.01); *H01L 21/02211* (2013.01); *H01L 21/02274* (2013.01); *C23C 16/513* (2013.01); *H01J 37/32467* (2013.01); *H01J 37/32724* (2013.01);
(Continued)

(58) Field of Classification Search
CPC ......... H01L 21/02131; H01L 21/02274; H01L 21/6833; H01J 37/3211; H01J 37/32449; H01J 2237/334; H01J 2237/3321; H01J 37/32724; H01J 37/32467; C23C 16/30; C23C 16/04; C23C 16/513
See application file for complete search history.

(56) References Cited

U.S. PATENT DOCUMENTS 5,872,065 A * 2/1999 Sivaramakrishnan .......................
C23C 16/401
257/E21.275
6,042,901 A * 3/2000 Denison ................ C23C 16/401
257/E21.278

(Continued)

FOREIGN PATENT DOCUMENTS

JP H10-284487 A 10/1998
JP 2001-507081 A 5/2001
WO 1998-028465 A1 7/1998

*Primary Examiner* — Karen Kusumakar
(74) *Attorney, Agent, or Firm* — Fenwick & West LLP

(57) ABSTRACT

A film forming method for a target object including a main surface and grooves formed in the main surface, includes a step of supplying of a first gas into the processing chamber, and a step of supplying a second gas and a high frequency power for plasma generation into the processing chamber to generate in the processing chamber a plasma of a gas including the second gas in the processing chamber. The first gas contains an oxidizing agent that does not include a hydrogen atom. The second gas contains a compound that includes one or more silicon atoms and one or more fluorine atoms and does not include a hydrogen atom. A film containing silicon and oxygen is selectively formed on the main surface of the target object except the grooves.

10 Claims, 5 Drawing Sheets

(51) Int. Cl.
 *C23C 16/509* (2006.01)
 *C23C 16/515* (2006.01)
 C23C 16/513 (2006.01)
 H01L 21/683 (2006.01)

(52) U.S. Cl.
 CPC . *H01J 2237/334* (2013.01); *H01J 2237/3321* (2013.01); *H01L 21/6833* (2013.01)

(56) References Cited

U.S. PATENT DOCUMENTS 6,071,573 A * 6/2000 Koemtzopoulos ........................... C23C 16/4404
 427/237
2002/0187655 A1 * 12/2002 Tan ....................... C23C 16/401
 438/788

* cited by examiner

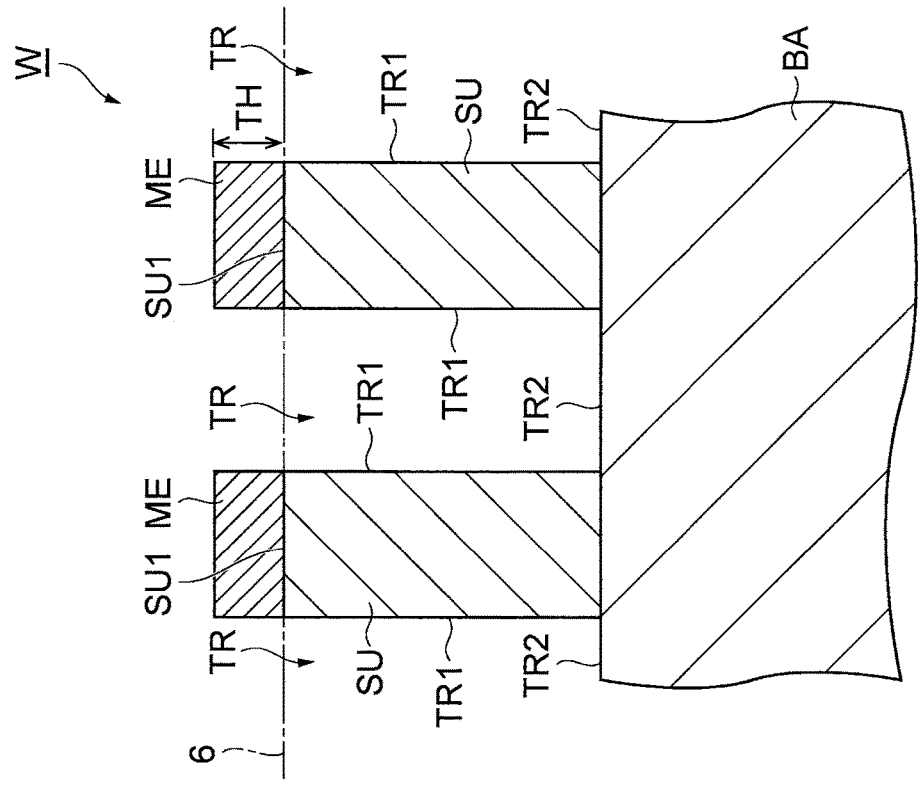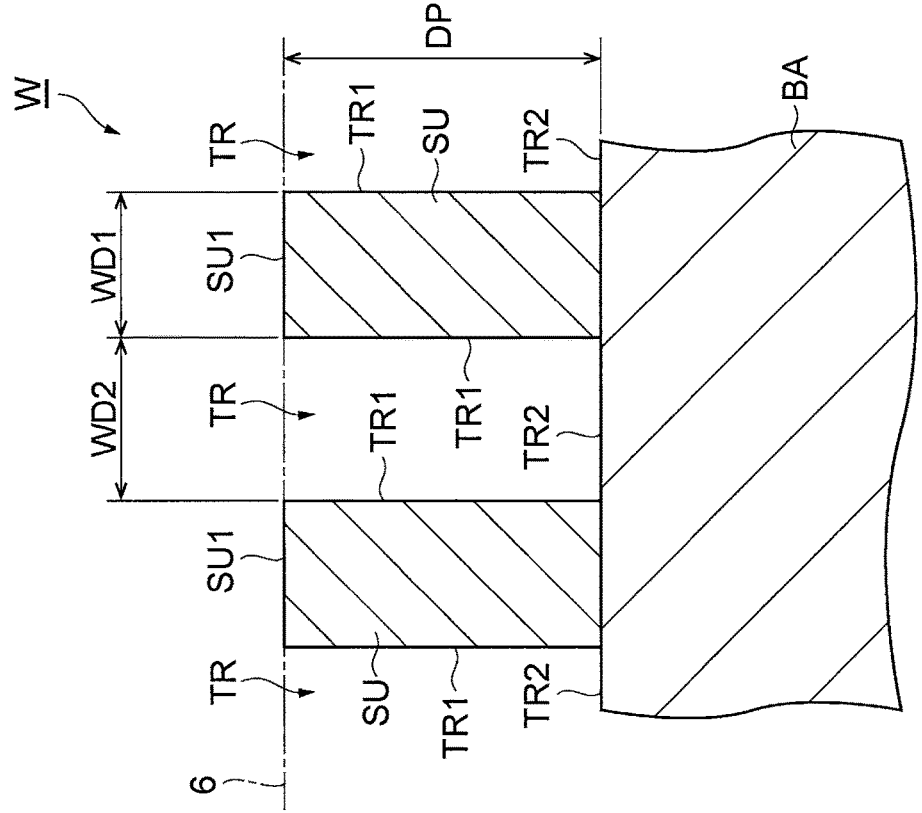

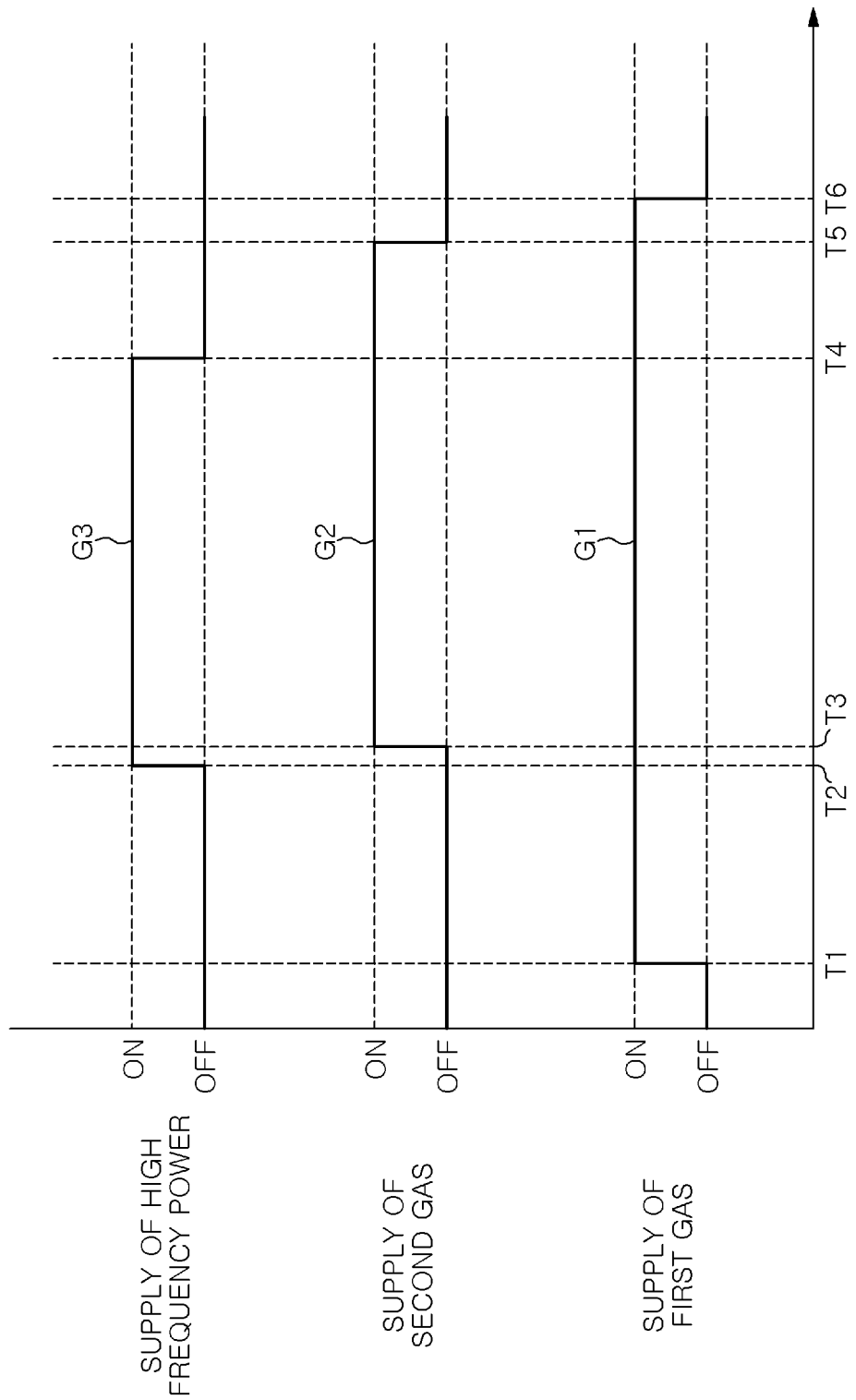

FILM FORMING METHOD

CROSS-REFERENCE TO RELATED APPLICATIONS

This application claims priority to Japanese Patent Application No. 2017-046471 filed on Mar. 10, 2017, the entire contents of which are incorporated herein by reference.

FIELD OF THE INVENTION

The present disclosure relates to a film forming method for a target object.

BACKGROUND OF THE INVENTION

In manufacturing semiconductors, it is required to form a fine wiring pattern along with a trend toward miniaturization of semiconductor devices. For example, Japanese Patent Application Publication No. 2001-507081 discloses a technique related to inductively coupled plasma CVD capable of forming a dielectric film having etching resistance. Japanese Patent Application Publication No. H10-284487 discloses a technique related to a method for depositing a dielectric Si—O—F film on a substrate. In addition, a technique for performing selective pattern formation while suppressing complication of processing is disclosed in Japanese Patent Application No. 2016-121820, and a technique for forming a film by filling SiN which is related to a technique for suppressing generation of deposits on a side surface is disclosed in Japanese Patent Application No. 2016-121826.

In the case of forming a fine wiring pattern, there is known, e.g., a technique for suppressing a film forming rate on a side surface by adding an etchant in an air gap process for a low-k film. In that case, a sufficient difference in an etching rate between layers may be required to maintain a pattern shape through a plurality of etching processes. However, in the case of forming layers having different etching rates along a predefined fine wiring pattern, complicated processes may be required. Therefore, there is required a technique of, while maintaining a shape of a pattern, easily laminating a layer having a shape corresponding to the pattern shape on the pattern.

SUMMARY OF THE INVENTION

In accordance with an aspect, there is provided a film forming method for a target object including a main surface and grooves formed in the main surface. The film forming method includes: a first step of accommodating the target object in a processing chamber of a plasma processing apparatus; a second step of supplying of a first gas into the processing chamber; and a third step of supplying a second gas and a high frequency power for plasma generation into the processing chamber to generate in the processing chamber a plasma of a gas including the second gas in the processing chamber. The first gas contains an oxidizing agent that does not include a hydrogen atom, and the second gas contains a compound that includes one or more silicon atoms and one or more fluorine atoms and does not include a hydrogen atom. A film containing silicon and oxygen is selectively formed on the main surface of the target object except the grooves.

BRIEF DESCRIPTION OF THE DRAWINGS

The objects and features of the present disclosure will become apparent from the following description of embodiments, given in conjunction with the accompanying drawings, in which:

FIGS. 3A and 3B are cross sectional views schematically showing a state of a target object before and after execution of the steps of the method shown in FIG. 1, respectively;

FIG. 4 shows timings of executing various processes in the steps of the method shown in FIG. 1.

DETAILED DESCRIPTION OF THE EMBODIMENTS

Figure 1:
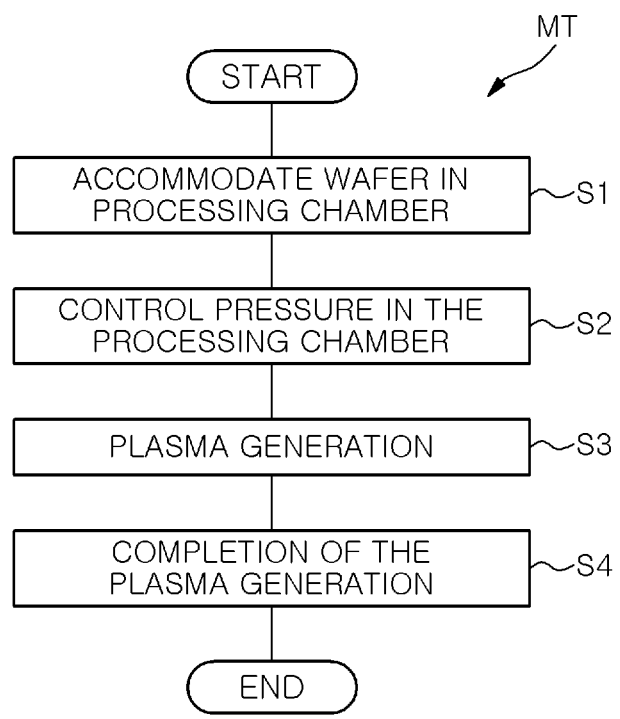
FIG. 1 is a flowchart showing a method according to an embodiment.

Hereinafter, various embodiments will be described in detail with reference to the accompanying drawings. Like reference numerals will be given to like or corresponding parts throughout the drawings. FIG. 1 is a flowchart showing a method according to an embodiment. A method MT according to an embodiment shown in FIG. 1 is a film forming method for a target object (hereinafter, may be referred to as "wafer"). In the method MT according to an embodiment, a series of processes can be performed by using a single plasma processing apparatus.

Figure 2:
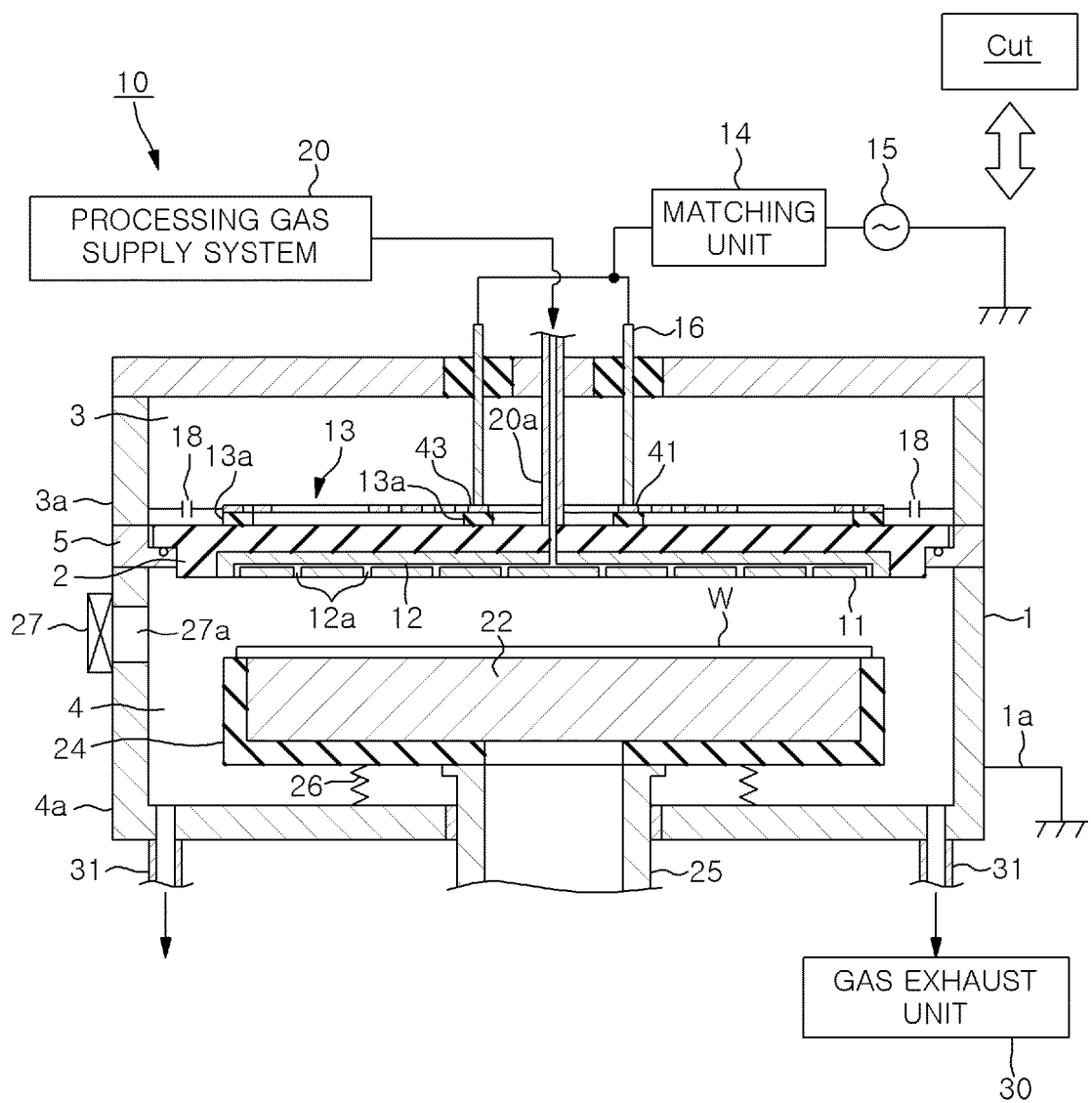
FIG. 2 is a cross sectional view of an example of a plasma processing apparatus for performing the method shown in FIG. 1.

FIG. 2 shows an example of a plasma processing apparatus. FIG. 2 schematically shows a cross sectional structure of a plasma processing apparatus 10 that can be used in various embodiments of a film forming method for a target object. As shown in FIG. 2, the plasma processing apparatus 10 is an inductively coupled plasma etching apparatus.

The plasma processing apparatus 10 includes a processing container 1. The processing container 1 is airtightly sealed. The processing container 1 is made of a conductive material. For example, an inner wall surface of the processing container 1 may be made of a material such as anodically oxidized aluminum or the like. The processing container 1 is separably assembled and is grounded through a ground line 1a. The processing container 1 is horizontally partitioned into an antenna chamber 3 and a processing chamber 4 by a dielectric wall 2. The dielectric wall 2 serves as a ceiling wall of the processing chamber 4. The dielectric wall 2 is made of, e.g., ceramic such as $Al_2O_3$ or the like, quartz, or the like.

A shower head 11 for supplying a processing gas is inserted at a lower portion of the dielectric wall 2. The shower head 11 has a cross shape and supports the dielectric wall 2 from the bottom thereof. The shower head 11 for supporting the dielectric wall 2 is suspended at a ceiling of the processing container 1 by a plurality of suspenders (not shown).

The shower head 11 may be made of a conductive material such as a metal or the like. An inner surface of the shower head 11 may be made of, e.g., anodically oxidized aluminum or the like to prevent contamination. A gas channel 12 extending along the dielectric wall 2 is formed at the shower head 11. The gas channel 12 communicates with a plurality of gas supply holes 12a extending toward a susceptor 22. A gas supply line 20a is provided at a central portion of a top surface of the dielectric wall 2 to communicate with the gas channel 12. The gas supply line 20a extends from the dielectric wall 2 to the outside of the processing container 1 and is connected to a processing gas supply system 20 including a processing gas supply source, a valve system or the like. During plasma processing, the processing gas from the processing gas supply system 20 is supplied into the shower head 11 through the gas supply line 20*a* and discharged into the processing chamber 4 through the gas supply holes 12*a* on the bottom surface of the shower head 11 (which faces the processing chamber 4).

An inwardly projecting supporting bracket 5 is provided between a sidewall 3*a* of the antenna chamber 3 and a sidewall 4*a* of the processing chamber 4 in the processing container 1. The dielectric wall 2 is mounted on the supporting bracket 5.

In the antenna chamber 3, a high frequency antenna 13 is installed above the dielectric wall 2 to face the dielectric wall 2. The high frequency antenna 13 is separated from the dielectric wall 2 by a distance of, e.g., 50 mm or less, through a spacer 13*a* made of an insulating material. Four power feed members 16 extending in a vertical direction perpendicular to the top surface of the dielectric wall 2 are provided near a central portion of the antenna chamber 3. A high frequency power supply 15 is connected to the four power feed members 16 via a matching unit 14. The power feed members 16 are arranged around the gas supply line 20*a*.

During the plasma processing, a high frequency power for plasma generation, which has a frequency of, e.g., about 13.56 MHz for induced electric field generation, is supplied from the high frequency power supply 15 into the processing chamber 4 through the high frequency antenna 13. By supplying the high frequency power for plasma generation from the high frequency power supply 15 into the processing chamber 4, an induced electric field is generated in the processing chamber 4. Due to the induced electric field thus generated, a plasma of the processing gas supplied into the processing chamber 4 from the shower head 11 is generated. The shower head 11 has a cross shape. The supply of the high frequency power from the high frequency antenna 13 is not disturbed even when the shower head 11 is made of a metal.

The susceptor (mounting table) 22 is provided at a lower portion in the processing chamber 4 (opposite side of the dielectric wall 2). The susceptor 22 faces the high frequency antenna 13 via the dielectric wall 2. A wafer W that is a target object is mounted on the susceptor 22. The susceptor 22 may be made of a conductive material. The surface of the susceptor 22 may be made of, e.g., anodically oxidized aluminum or aluminum thermally sprayed with alumina. The wafer W mounted on the susceptor 22 is attracted and held on the susceptor 22 by an electrostatic chuck (not shown).

The susceptor 22 is accommodated in an insulating frame 24 and supported by a column 25. The column 25 has a hollow structure. A bellows 26 for airtightly surrounding the column 25 is installed between the insulating frame 24 where the susceptor 22 is accommodated and a bottom portion of the processing container 1 (where the column 25 is provided). A loading/unloading port 27*a* through which the wafer W is loaded/unloaded and a gate valve 27 for opening/closing the loading/unloading port 27*a* are provided on the sidewall 4*a* of the processing chamber 4.

The susceptor 22 has therein a temperature control mechanism (not shown) including a heating unit such as a ceramic heater or the like, a coolant path, or the like, and a temperature sensor (not shown) in order to control the temperature of the wafer W. Pipes and wirings of the temperature control mechanism, the temperature sensor and other components are drawn out of the processing container 1 through the inside of the column 25.

A gas exhaust unit 30 including a vacuum pump or the like is connected to the bottom portion of the processing chamber 4 (where the column 25 is provided) through a gas exhaust line 31. The processing chamber 4 is exhausted by the gas exhaust unit 30. During the plasma processing, a pressure in the processing chamber 4 is set to and maintained at a predetermined vacuum level (e.g. 1.33 Pa).

The high frequency antenna 13 includes four power feed portions (e.g., a power feed portion 41, a power feed portion 43 and the like). The four power feed portions are connected to the power feed member 16. The power feed portions are spaced apart from each other at an interval of, e.g., 90 degrees, about the center of the high frequency antenna 13. Two antenna lines extend from each of the four power feed portions to the outside. Each of the antenna lines is grounded through a capacitor 18.

The plasma processing apparatus 10 includes a control unit Cnt. The control unit Cnt is a computer including a processor, a storage unit, an input device, a display device and the like. The control unit Cnt controls the respective components of the plasma processing apparatus 10.

The control unit Cnt operates by a program based on an inputted recipe and transmits a control signal. By using the control signal from the control unit Cnt, it is possible to control selection of gases supplied from the processing gas supply system 20, flow rates of gases supplied from the processing gas supply system 20, an exhaust operation of the gas exhaust unit 30, power supply from the high frequency power supply 15, and a temperature of the susceptor 22. The respective steps (steps S1 to S4 shown in FIG. 1) of the film forming method (method MT) for a target object, which are disclosed in this specification, can be performed by operating the respective components of the plasma processing apparatus 10 under the control of the control unit Cnt.

Referring back to FIG. 1, the method MT will be described in detail. Hereinafter, an example in which the plasma processing apparatus 10 is used for performing the method MT will be described. In the following description, FIGS. 3A, 3B and 4 will be referred to. FIG. 3A is a cross sectional view schematically showing a state of a target object before the execution of the respective steps of the method MT shown in FIG. 1. FIG. 3B is a cross sectional view schematically showing a state of the target object after the execution of the respective steps of the method MT shown in FIG. 1. FIG. 4 shows timings of executing various processes performed in the respective steps of the method MT shown in FIG. 1.

Figure 5:
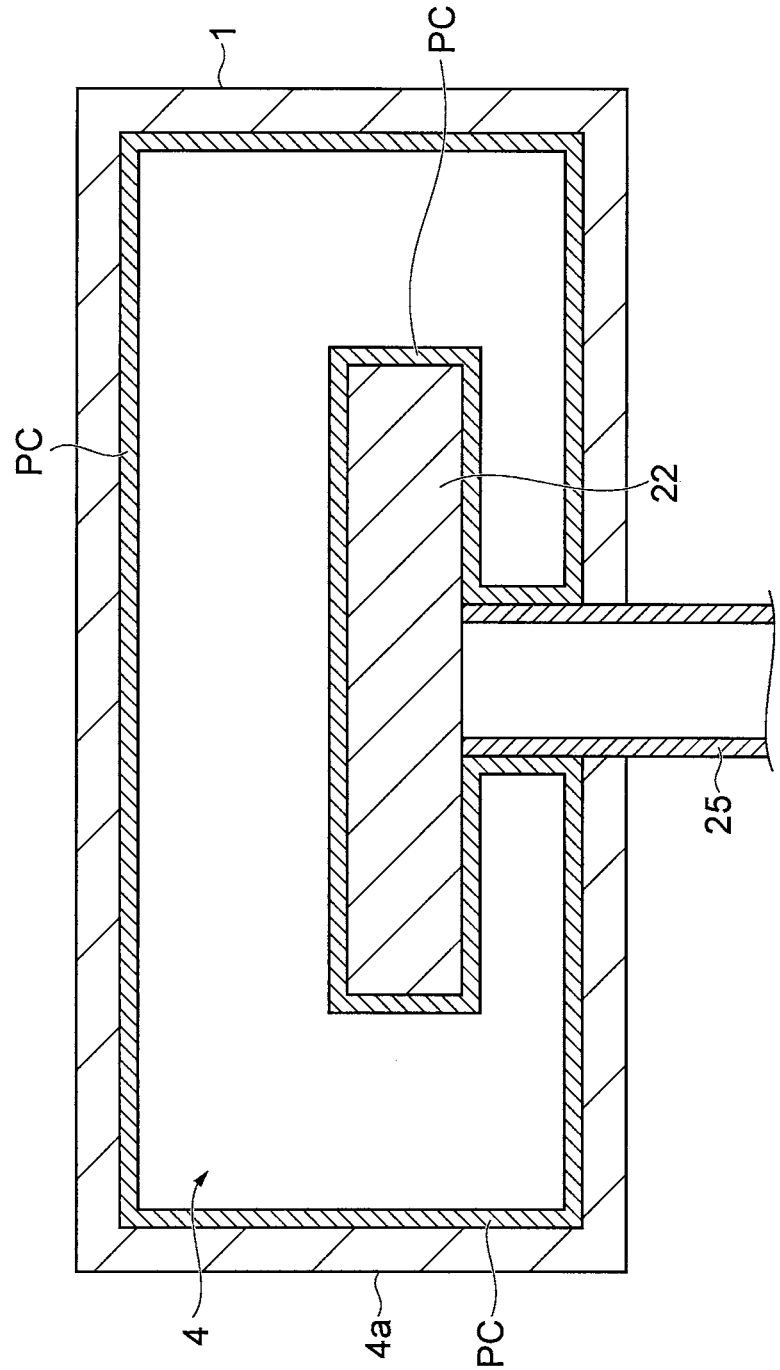
FIG. 5 schematically shows a state in which a pre-coat film is formed on an inner surface of a processing chamber.

The method MT shown in FIG. 1 includes, as main steps, steps S1 to S4. In the step S1 (first step), the wafer W is accommodated in the processing chamber 4 of the processing container 1 of the plasma processing apparatus 10. Before the execution of the step S1, the inner surface of the processing chamber 4 used in the step S1 may have a portion coated with a pre-coat film containing silicon and fluorine. FIG. 5 schematically shows a state in which a pre-coat film PC is formed on an inner surface of the processing chamber 4. In FIG. 5, the pre-coat film PC is formed on the entire inner surface of the processing chamber 4. However, the pre-coat film PC may be formed on a part of the inner surface of the processing chamber 4. The pre-coat film PC contains silicon and fluorine. The amount of silicon in the pre-coat film PC may be equal to or less than the amount of fluorine in the pre-coat film. The thickness of the pre-coat film PC is substantially uniform. On average, the thickness of the pre-coat film PC is about 50 nm to 100 nm or more.

In FIG. 4, there are illustrated timing (timing T1) of starting supply of a first gas into the processing chamber 4 (the supply of the first gas is switched from OFF to ON), timing (second start timing, timing T2) of starting supply of the high frequency power for plasma generation into the processing chamber 4 (the supply of the high frequency power for plasma generation is switched from OFF to ON), timing (first start timing, timing T3) of starting supply of a second gas into the processing chamber 4 (the supply of the second gas is switched from OFF to ON), timing (second termination timing, timing T4) of terminating the supply of the high frequency power for plasma generation into the processing chamber 4 (the supply of the high frequency power for plasma generation is switched from ON to OFF), timing (first termination timing, timing T5) of terminating the supply of the second gas into the processing chamber 4 (the supply of the second gas is switched from ON to OFF), and timing (third termination timing, timing T6) of terminating the supply of the first gas into the processing chamber 4 (the supply of the first gas is switched from ON to OFF).

In FIG. 4, a graph G1 indicates the timing of starting the supply of the first gas into the processing chamber 4 and the timing of terminating the supply of the first gas into the processing chamber 4 in the method MT. The supply of the first gas into the processing chamber 4 (ON state) is continued from the timing T1 to the timing T6. The timing T6 is later than the timing T1. In FIG. 4, a graph G2 indicates the timing of starting the supply of the second gas into the processing chamber 4 and the timing of terminating the supply of the second gas into the processing chamber 4 in the method MT. The supply of the second gas into the processing chamber 4 (ON state) is continued from the timing T3 to the timing T5. The timing T5 is later than the timing T3. In FIG. 4, a graph G3 indicates a timing of starting the supply of the high frequency power for plasma generation into the processing chamber 4 and the timing of terminating the supply of the high frequency power for plasma generation into the processing chamber 4 in the method MT. The supply of the high frequency power for plasma generation into the processing chamber 4 (ON state) is continued from the timing T2 to the timing T4. The timing T4 is later than the timing T2.

As shown in FIG. 3A, the wafer W accommodated in the processing chamber 4 in the step S1 includes a base portion BA, a main surface 6, surface layer portions SU and grooves TR. In the main surface 6, the surface layer portions SU and the grooves TR are provided alternately. The surface layer portions SU and the grooves TR are provided in the main surface 6. End surfaces SU1 of the surface layer portions SU define a pattern shape on the main surface 6 of the wafer W.

A depth DP of the grooves TR (height of the surface layer portion SU) may be about 10 nm to 250 nm. A width WD1 of the surface layer portion SU may be about 10 nm to 250 nm. A width WD2 of the grooves TR may be about 10 nm to 250 nm.

The main surface 6 (the end surface SU1 of the surface layer portion SU) and the side surfaces TR1 of the grooves TR are made of an insulating material. The insulating material may be, e.g., a low-k material. More specifically, the insulating material may be amorphous carbon silicon, silicon or the like. For example, the surface layer portion SU includes the end surface SU1 (the main surface 6) and the side surfaces of the surface layer portion SU (the side surfaces TR1 of the grooves TR). The surface layer portion SU may be made of an insulating material. The base portion BA may be made of a metal such as Cu or the like.

As shown in FIGS. 3A and 3B, the base portion BA and the surface layer portion SU may be separate parts made of different materials. However, the base portion BA and the surface layer portion SU may be a single part made of the same material. When the base portion BA and the surface layer portion SU are a single part made of the same material, both of the main surface 6 (the end surface SU1) and the surfaces of the grooves TR (the side surfaces TR1 and the bottom surfaces TR2) may be made of an insulating material (e.g., a low-k material).

After the step S1, in the step S2 (second step), a pressure in the processing chamber 4 is controlled to a processing pressure. Specifically, a pressure in the processing chamber 4 is controlled by starting the supply of the first gas into the processing chamber 4. As can be seen from the graph G1 of FIG. 4, in the step S2, at the timing T1, the supply of the first gas into the processing chamber 4 is started (the supply of the first gas is switched from OFF to ON).

The first gas may contain an oxidizing agent without a hydrogen atom. Particularly, the first gas may contain one of $O_2$, $O_3$ and $N_xO_y$ (x and y being an integer greater than or equal to 1) among the oxidizing agents without a hydrogen atom. More specifically, the first gas may be one of $O_2$ gas, $O_3$ gas and $N_xO_y$ gas (x and y being an integer greater than or equal to 1) among oxidizing agents that does not contain a hydrogen atom, or a gaseous mixture containing one of $O_2$ gas $O_3$ gas and $N_xO_y$ gas (x and y being an integer greater than or equal to 1).

After the step S2, in the step S3 (third step), film portions ME are selectively formed on the main surface 6 (the end surface SU1) of the wafer W. In the step S3, a process of generating in the processing chamber 4 a plasma of a gas in the processing chamber 4 which contains the second gas is started by supplying the second gas and the high frequency power for plasma generation into the processing chamber 4. In the step S3, a film is not formed on the surfaces (the side surfaces TR1 and the bottom surfaces TR2) of the grooves TR and the film portions ME are formed on the main surface 6 (the end surface SU1) of the wafer W. A thickness TH of the film portions ME is about 1 nm to 100 nm.

The second gas used in the step S3 may contain a compound that includes one or more silicon atoms and one or more fluorine atoms and does not include a hydrogen atom. In that case, in the plasma generated in the step S3, elements of deposition species are silicon and elements of etching species are fluorine. The second gas contains one or a plurality of gases having a composition of $Si_xF_y$ (x and y being an integer greater than or equal to 1). The second gas may be, e.g., a gas containing $SiF_4$, a gas containing both of $SiF_4$ and $Si_2F_6$, or the like. A flow rate of the second gas in the step S3 is relatively small and may be within a range from 1 sccm to 50 sccm, for example. The case in which the second gas further includes a rare gas (e.g., He, Ar, Xe or the like) may be applied to the method MT according to an embodiment.

In the step S3, the timing T3 of starting supply of the second gas into the processing chamber 4 is the same as or later than the timing T2 of starting the supply of the high frequency power for plasma generation into the processing chamber 4. In other words, on the assumption that values of the timings T1, T2 and T3 are set to t1, t2 and t3, respectively, t1, t2 and t3 satisfy a condition of t1<t2≤t3.

As a result of the processing in the step S3, the film portions ME are formed only on the main surface 6 (the end surface SU1) of the wafer W and hardly formed on the surfaces (the side surfaces TR1 and the bottom surfaces TR2) of the grooves TR. By executing the step S3, the film portions ME are selectively formed on the main surface 6 (the end surface SU1) of the wafer W, i.e., on the main surface 6 of the wafer W except the grooves TR.

The first gas used in the step S2 is, e.g., $O_2$ gas or $O_3$ gas. The second gas used in the step S3 is $SiF_4$ gas or a gaseous mixture containing $SiF_4$ and $Si_2F_6$. When an element of etching species in the plasma generated in the step S3 is fluorine, the film portion ME contains silicon and oxygen. For example, the film portion ME may be a SiOF film.

When the step S3 is executed, the temperature of the wafer W is lower than 450° C. When the temperature of the wafer W is higher than or equal to 450° C., it is difficult to form the film portions ME on the main surface 6 (the end surface SU1) of the wafer W.

After the step S3, in the step S4 (fourth step), the generation of the plasma in the processing chamber 4 which is started in the step S3 is completed. In the step S4, the supply of the high frequency power for plasma generation into the processing chamber 4 is stopped and, then, the supply of the first gas into the processing chamber 4 and the supply of the second gas into the processing chamber 4 are stopped. The timing T5 of terminating the supply of the second gas into the processing chamber 4 is within a period between the timing T4 of terminating the supply of the high frequency power for plasma generation into the processing chamber 4 (inclusive) and the timing T6 of terminating the supply of the first gas into the processing chamber 4 (exclusive) or within a period between the timing T4 (exclusive) and the timing T6 (inclusive). In other words, on the assumption that values of the timings T4, T5 and T6 are set to t4, t5 and t6, respectively, t4, t5 and t6 satisfy a condition of t4≤t5<t6 or a condition of t4<t5≤t6.

The method MT according to the above-described embodiment can provide at least the following effects. The present inventors have found that, by generating a plasma by using the first gas containing an oxidizing agent that does not include a hydrogen atom and the second gas containing a compound that includes one or more silicon atoms and one or more fluorine atoms and does not include a hydrogen atom, the film portions ME containing silicon and oxygen are formed on the main surface (the end surface SU1) of the wafer W and hardly formed on the surfaces (the side surfaces TR1 and the side surfaces TR2) of the grooves TR which are provided in the main surface 6. In accordance with the method MT, only by generating a plasma by using the first gas containing an oxidizing agent that does not include a hydrogen atom and the second gas containing a compound that includes one or more silicon atoms and one or more fluorine atoms and does not include a hydrogen atom, it is possible to selectively form the film portions ME on the main surface 6 except the grooves TR of the wafer W which define the pattern shape (the end surface SU1 of the surface layer portion SU). Therefore, it is possible to easily laminate a layer having a shape corresponding to the pattern shape on the pattern while maintaining the pattern shape.

The method MT according to the embodiment can be applied to a case where the main surface 6 (the end surface SU1) and the side surfaces TR1 of the grooves TR are made of an insulating material.

After the pressure in the processing chamber is controlled by the supply of the first gas within a period from the start of the step S2 to the start of the step S3 (period between the timing T1 and the timing T2), the film formation is started by stably generating a plasma in the processing chamber 4 by starting the supply of the high frequency power for plasma generation in the step S3 (timing T2) and starting the supply of the second gas into the processing chamber 4 (timing T3). Especially, when the timing T3 and the timing T2 coincide with each other, the effect of an oxygen plasma generated from the first gas on the surface of the wafer W is sufficiently reduced and, thus, the oxidation on the surface of the wafer W can be sufficiently suppressed.

After the film formation is completed by extinguishing the plasma at the timing T4, the supply of the second gas and the supply of the first gas are stopped. Since the timing T6 of terminating the supply of the first gas is later than the timing T5 of terminating the supply of the second gas, the processing chamber can be efficiently purged by the first gas after the extinguishment of the plasma (later than the timing T5).

When, before the formation of the film portions ME is started in the step S1, the pre-coat film PC containing silicon and fluorine is previously formed on the inner surface of the processing chamber 4 for performing the formation of the film portions ME, the plasma can be more efficiently generated by atoms of silicon and fluorine which are released from the second gas and the pre-coat film PC as well as the second gas containing silicon and fluorine.

Test Example 1

The steps S2 and S3 can be performed under the following conditions, for example. The following conditions are applied to a case where the pre-coat film PC is not formed on the inner surface of the processing chamber 4.

Pressure in the processing chamber 4: 0.67 to 13.3 Pa

Frequency and high frequency power of the high frequency power supply 15: 13.56 MHz, 0 to 2000 Watt Processing gas: $O_2$ gas (first gas), $SiF_4$ gas (second gas)

Test Example 2

The pre-coat film PC containing silicon and fluorine may be formed on the inner surface of the processing chamber 4 used in the step S1. The film thickness of the pre-coat film PC is about 100 nm or less. The pre-coat film PC is formed substantially on the entire inner surface of the processing chamber 4.

The principle of the present disclosure has been illustrated and described in the above embodiments. However, it is recognized by those skilled in the art that the present disclosure can be modified in arrangement and details without departing from the principle. The present disclosure is not limited to the specific configurations disclosed in the above embodiments. Therefore, the applicants claim all modifications and changes falling within the scope of claims and resulting from the scope of spirit thereof.

What is claimed is:

1. A film forming method for a target object including a main surface and grooves formed in the main surface, the method comprising:
    accommodating the target object in a processing chamber of a plasma processing apparatus;
    after the accommodating, supplying a first gas into the processing chamber; and
    after the supplying the first gas, supplying a second gas and a high frequency power for plasma generation in the processing chamber by using a gas that includes the second gas in the processing chamber,
    wherein:
    the first gas comprises an oxidizing agent that does not include a hydrogen atom;
    the second gas contains a compound that includes one or more silicon atoms and one or more fluorine atoms and does not include a hydrogen atom;
    a film containing silicon and oxygen is selectively formed on the main surface of the target object except the grooves; and
    a temperature of the target object during the supplying the second gas is lower than 450° C.

2. The film forming method of claim 1, wherein the main surface and side surfaces of the grooves comprise an insulating material.

3. The film forming method of claim 1, wherein the second gas comprises one or a plurality of gases having a composition of $Si_xF_y$, x and y being an integer greater than or equal to 1.

4. The film forming method of claim 3, wherein the second gas comprises $SiF_4$ or both of $SiF_4$ and $Si_2F_6$.

5. The film forming method of claim 1, wherein the first gas comprises at least one of $O_2$, $O_3$ and $N_xO_y$, x and y being an integer greater than or equal to 1.

6. The film forming method of claim 1, wherein the second gas further comprises a rare gas.

7. The film forming method of claim 1, wherein in the supplying the second gas and the high frequency power, a first start time of starting the supply of the second gas into the processing chamber is later than or equal to a second start time of starting the supply of the high frequency power for plasma generation in the processing chamber.

8. The film forming method of claim 1, further comprising terminating the plasma,
wherein in the terminating, a first termination time of terminating the supply of the second gas into the processing chamber is within a period between a second termination time of terminating the supply of the high frequency power for plasma generation in the processing chamber inclusive and a third termination time of terminating the supply of the first gas into the processing chamber exclusive or within a period between the second termination time exclusive and the third termination time inclusive.

9. The film forming method of claim 1, wherein in the accommodating the target object in the processing chamber, an inner surface of the processing chamber has a portion coated with a pre-coat film containing silicon and fluorine.

10. The film forming method of claim 1, wherein, during supplying a second gas and the high frequency, a pressure in the processing chamber power is in a range of 0.67 Pa to 13.3 Pa.

* * * * *